United States Patent
Tao et al.

(10) Patent No.: US 12,381,116 B2
(45) Date of Patent: Aug. 5, 2025

(54) METHOD OF MANUFACTURING AN INTERCONNECTION STRUCTURE FOR A SEMICONDUCTOR DEVICE HAVING A SPACER SEPARATING FIRST AND SECOND CONDUCTIVE LINES

(71) Applicant: IMEC VZW, Leuven (BE)

(72) Inventors: Zheng Tao, Heverlee (BE); Stefan Decoster, Bertem (BE)

(73) Assignee: IMEC VZW, Leuven (BE)

( * ) Notice: Subject to any disclaimer, the term of this patent is extended or adjusted under 35 U.S.C. 154(b) by 529 days.

(21) Appl. No.: 17/833,223

(22) Filed: Jun. 6, 2022

(65) Prior Publication Data

US 2023/0170255 A1 Jun. 1, 2023

(30) Foreign Application Priority Data

Nov. 29, 2021 (EP) .................................... 21210949

(51) Int. Cl.
| | |
|---|---|
| *H01L 21/768* | (2006.01) |
| *H01L 21/3213* | (2006.01) |
| *H01L 23/522* | (2006.01) |
| *H01L 23/532* | (2006.01) |

(52) U.S. Cl.
CPC .. *H01L 21/76897* (2013.01); *H01L 21/32139* (2013.01); *H01L 21/76837* (2013.01); *H01L 21/76883* (2013.01); *H01L 23/5226* (2013.01); *H01L 23/53252* (2013.01)

(58) Field of Classification Search
CPC ......... H01L 21/76897; H01L 21/32139; H01L 21/76837; H01L 21/76813; H01L 21/76831; H01L 21/76877; H01L 23/53252; H01L 23/5283; H01L 23/5226
See application file for complete search history.

(56) References Cited

U.S. PATENT DOCUMENTS

| | | | | |
|---|---|---|---|---|
| 9,502,350 | B1 * | 11/2016 | Bonilla | ............. H01L 23/53228 |
| 2002/0117703 | A1 * | 8/2002 | Gambino | ............. H01L 23/5223 |
| | | | | 257/E21.582 |

(Continued)

FOREIGN PATENT DOCUMENTS

EP 3217425 A1 9/2017

OTHER PUBLICATIONS

Extended European Search Report issued in European Patent Application No. 21210949.0 dated May 13, 2022.

*Primary Examiner* — Khiem D Nguyen
(74) *Attorney, Agent, or Firm* — MCDONNELL BOEHNEN HULBERT & BERGHOFF LLP

(57) ABSTRACT

A method for forming an interconnection structure (10) for a semiconductor device is disclosed, wherein a first conductive layer is etched to form a set of third conductive lines (113) above a first and second conductive line (101, 108). At least one of the third conductive lines comprises a contacting portion forming a first via connection (114) to the second conductive line. The method further comprises forming spacers (115) on side walls of the set of third conductive lines, and forming, between two neighboring spacers, a via hole (116) extending to the underlying first conductive line. A second conductive layer is deposited, filling the via hole to form a second via connection (118) and forming a set of fourth conductive lines (119) extending between the spacers.

10 Claims, 4 Drawing Sheets

(56) References Cited

U.S. PATENT DOCUMENTS

| | | | |
|---|---|---|---|
| 2007/0072407 A1* | 3/2007 | Kim | H01L 21/7684 257/E21.507 |
| 2009/0206489 A1* | 8/2009 | Li | H01L 21/76816 257/E21.295 |
| 2015/0091137 A1* | 4/2015 | Hendricks | H01L 21/02318 525/50 |
| 2019/0067089 A1* | 2/2019 | Yang | H01L 23/5226 |
| 2021/0118732 A1 | 4/2021 | Chen et al. | |

* cited by examiner

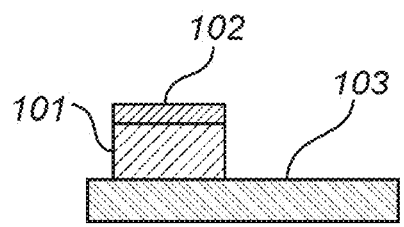
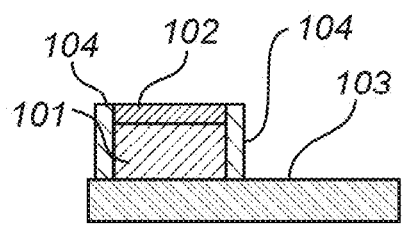
Fig. 1A    Fig. 1B
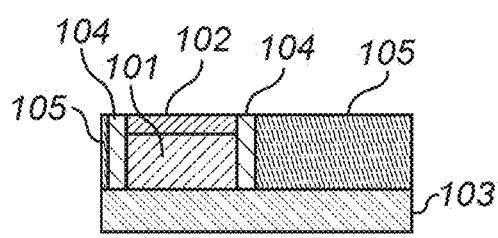
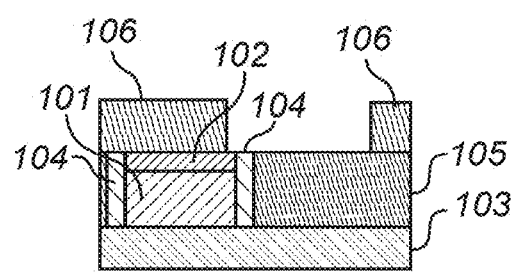
Fig. 1C    Fig. 1D
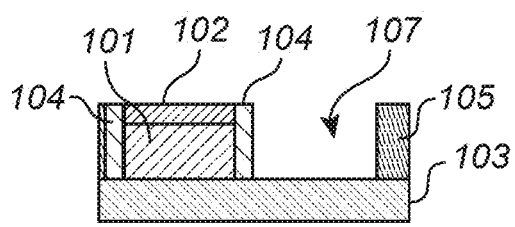
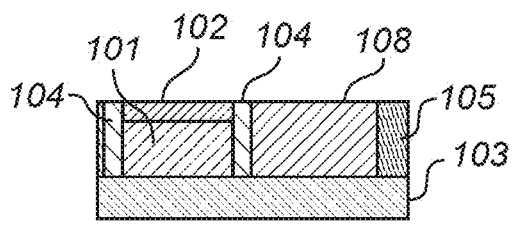
Fig. 1E    Fig. 1F
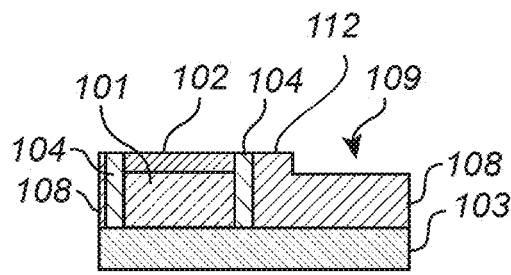
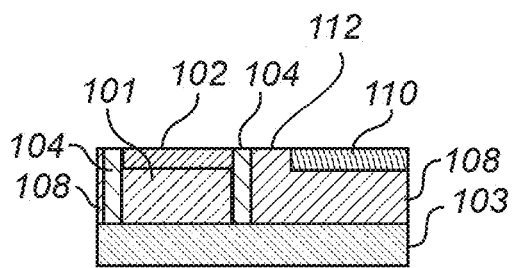
Fig. 1G    Fig. 1H ND OF MANUFACTURING AN
INTERCONNECTION STRUCTURE FOR A
SEMICONDUCTOR DEVICE HAVING A
SPACER SEPARATING FIRST AND SECOND
CONDUCTIVE LINES

CROSS-REFERENCE

The present application claims priority from European Patent Application No. 21210949.0, filed on Nov. 29, 2021, which is incorporated by reference in its entirety.

FIELD OF THE DISCLOSURE

The present disclosure relates to interconnection structures for semiconductor devices.

BACKGROUND OF THE DISCLOSURE

Modern circuit fabrication typically includes processes of forming electrical interconnection structures for interconnecting semiconductor devices in a functioning circuit. An interconnection structure may include one or more interconnection levels or tiers, which are formed above the active device region. An interconnection level generally includes horizontal conductive paths or lines arranged in an insulating material layer. Conductive lines of different interconnection levels may be interconnected by conductive vias extending vertically through the insulating layers.

In conventional circuit fabrication, an interconnection level is typically formed in what in the art is known as a "dual damascene process". According to this approach, horizontally extending trenches are etched in the insulating layer. Further, vertically extending via holes are formed in the insulating layer. Thereafter, the trenches and via holes are simultaneously filled with a conductive material to form conductive lines in the trenches and conductive vias in the via holes. The process may be repeated to form a stack of interconnection levels.

However, in using state-of-the-art patterning and etching techniques it becomes increasingly difficult to meet the desire for the ever more aggressive line pitches. Forming closely spaced neighboring vias without affecting each other and adjacent structures is especially challenging.

SUMMARY OF THE DISCLOSURE

An objective of the present disclosure is thus to provide a method and an interconnection structure allowing forming of interconnection structures comprising tight-pitch conductive lines and vias. Further and alternative objectives may be understood from the following.

According to a first aspect of the present disclosure, there is provided a method for forming an interconnection structure for a semiconductor device, comprising:

forming a first conductive layer above a first conductive line and a second conductive line, wherein the first and second conductive lines are arranged with a respective end portion abutting a spacer separating the first and second conductive lines from each other, wherein the first conductive line is covered by a first mask layer separating the first line from the conductive layer, and wherein the second conductive line is partly covered by a second mask layer, allowing a contacting portion of the first conductive layer to contact the second conductive line;

etching the first conductive layer to form a set of third conductive lines, wherein at least one of the third conductive lines comprises said contacting portion;

forming spacers on side walls of the set of third conductive lines;

forming, between two neighboring spacers, a via hole extending through the first mask to the underlying first conductive line;

depositing a second conductive layer filling the via hole and forming a set of fourth conductive lines extending between said spacers.

According to a second aspect, an interconnection structure for a semiconductor device is provided, comprising a first conductive line and a second conductive line arranged with a respective end portion abutting a spacer separating the first and second conductive lines from each other, a first mask layer covering the first conductive line, and a second mask layer partly covering the second conductive line and arranged to expose an upper contacting portion of the second conductive line.

The interconnection structure further comprises a set of third conductive lines extending above the first and second conductive lines, wherein the second mask layer is arranged to allow at least one of the third conductive lines to contact a portion of the second conductive line, spacers extending on side walls of the set of third conductive lines, and a set of fourth conductive lines extending between the spacers, wherein at least one of the fourth conductive lines is connected to the first conductive line by means of a via connection.

The present disclosure allows for forming of vias connecting tight pitch conductive lines of an upper layer to tight pitch conductive lines of an underlying layer. Contrasting conventional damascene-style processing in which the conductive lines and vias are formed by the portions of the conductive layer deposited in pre-patterned trenches, the present disclosure process forms the set of third conductive lines by etching the deposited conductive layer into conductive lines. The set of fourth conductive lines are then formed between spacers arranged on sidewalls of the third conductive lines. The set of third conductive lines may accordingly be directly "printed" in the first conductive layer, whereas spacers may be used for defining, and self-aligning the set of fourth conductive lines.

The arrangement of the first mask, the second mask layer and the spacer separating the first and second conductive lines from each other further allows for the first and second vias to be self-aligned to the conductive lines of the underlying layer as well as the upper layer.

The first and second conductive lines may be considered as arranged tip-to-tip, that is, end to end. By separating the first and second conductive lines by a spacer, tip-to-tip spacings below 10 nm may be achieved. Such tight pitches are currently not possible to achieve with conventional EUV patterning techniques, and also difficult to provide by means of pattern transfer processes utilising dry etching techniques. As will be discussed in further detail below, the tip-to-tip arrangement of the first and second conductive lines may be achieved by a direct metal etch of the first conductive line, followed by spacer deposition and a damascene-style processing or direct metal etch of the second conductive line. The present disclosure allows for the first and second conductive lines to be contacted by vias that are arranged at a similarly tight pitch as the end portions of the first and second conductive lines.

By "conductive layer" is generally meant a layer formed of an electrically conductive material. Non-limiting examples of suitable conductive materials include, for instance, Ru, Mo, W, Al and Co as well as combinations thereof. Generally, it is possible to etch the electrically conductive material to form the set of third conductive lines from the first conductive layer.

By "spacers" or "spacer lines" are meant a layer, generally comprising a dielectric material, arranged on sidewalls of a conductive line, such as the set of third conductive lines. The spacers may define a separating distance, such as a dielectric separation between the first and second conductive lines as well as the sets of third and fourth conductive lines.

By "horizontal" is generally understood to be a direction parallel to the main plane of extension of the layers and substrate onto which the semiconductor device is formed. Consequently, by "vertical" is generally understood to be the direction normal to the main surface of the layers and the substrate. Further, the terms "upper" and "above", as well as "lower" and "below" may be understood as relating to different vertical levels as seen along a direction facing away from the main surface of the substrate.

By the terminology "using a layer as an etch mask" is hereby meant that one or more underlying layers are etched while said layer counteracts etching of the underlaying layer(s) in regions covered by said layer. The underlying layer(s) may hence be etched selectively to said layer acting as an etch mask.

According to an embodiment, the via hole may be formed using the neighboring spacers as an etch mask. This allows for the via hole to be self-aligned in a first direction between the spacers, and in a second direction, orthogonal to the first direction, by selective etching of the first mask layer covering the first conductive line. Thus, the present embodiment allows for the via hole to be fully self-aligned to the underlying first conductive line.

The via hole, and the resulting second via connection, may further be self-aligned to the fourth conductive line passing above the second via connection, as this fourth conductive line may be formed to extend between the neighboring spacers which also were used as an etch mask for forming the via hole.

According to an embodiment, the spacers may be formed by depositing a spacer material to embed the set of third conductive lines, cover the first and second mask layer between the set of third conductive lines, as well as the spacer separating the first and second conductive lines. In other words, the spacers may be formed by a conformal deposition process, resulting in a substantially uniform layer, which is then subject to an anisotropic etch to define the spacers on vertical sidewalls of the third conductive lines. Generally, the layer thickness of the spacer material may be precisely controlled to provide a well-defined thickness of the set of fourth conductive lines arranged therebetween.

Accordingly, the set of fourth conductive lines may be formed by filling the spacing or gap between neighboring spacers by a second conductive layer, using a damascene-style process. After the filling, excess material may be etched back or removed by planarization or polishing, such as for instance a chemical-mechanical polishing (CMP) process.

In alternative embodiments, the set of fourth conductive lines may be formed as spacers of conductive material arranged at sidewalls of the spacers.

According to some embodiments, a third mask layer, defining the set of third conductive lines, may be formed prior to etching the conductive layer. Further, a fourth mask layer may be formed by recessing the set of fourth conductive lines and forming the fourth mask layer therein. The third mask layer and the fourth mask layer may differ with respect to etch selectivity, which allows for a first one of the mask layers to be etched selectively to the second one of the mask layers. Generally, by etching a feature "A" of a first material selectively to (i.e., with respect to) a feature "B" of a second material, means exposing the features A and B to an etch process wherein the feature A is etched at a greater rate than the feature B. This may be achieved by selecting the material of feature A and the material of feature B as a combination of materials with different etch rates in the etch process. Hence, portions of the feature A exposed to the etching process may be removed while portions of the feature B exposed to the etch process may be preserved. The preservation of the feature B following the etch process may be complete (in the sense that the feature B is not affected appreciably during the etch process) or at least partial (in the sense that the feature B remains at least to the extent that it may serve its intended function during subsequent process steps).

According to an embodiment, a top surface of the third mask layer and a top surface of the fourth mask layer may be arranged on the same vertical height, thereby facilitating subsequent back end of line, BEOL, processing steps. The same vertical level may for instance be the result of a polishing process, such as CMP.

According to an embodiment, the sets of third and fourth conductive lines, which also may be referred to as the upper conductive layer, may be arranged to extend orthogonally to the first and second conductive lines, which accordingly may be referred to as the lower conductive layer.

According to an embodiment, the first via connection may be arranged adjacent to the spacer separating the first and second conductive lines. The lateral position of the first via connection may be determined by the second mask layer, which is arranged to cover a portion of the underlying second conductive line and leave another portion of the underlying second conductive line uncovered. In case the uncovered portion of the second conductive line is the end portion of the conductive line, abutting the separating spacer, the first via connection can be correspondingly aligned to the uncovered portion. By arranging the second via connection in a similar manner, that is, adjacent to the opposite side of the spacer separating the first and second conductive lines, the lateral distance between the first and second via connections may be reduced to a minimum corresponding to the lateral separation between the end portions of the first and second conductive lines. Put differently, the separating spacer in the lower conductive layer may be used to define the lateral separation, to pitch, between the neighboring via connections. As this is spacer controlled, the via-to-via distance may be relatively well defined and easy to control.

According to an embodiment, the lower conductive layer, comprising the first and second conductive lines separated by the spacer, may be formed by similar processing steps as outlined above for the upper conductive layer. Thus, the first conductive line may be formed on an insulating layer using the first mask layer as an etch mask, followed by forming the spacer on a sidewall of a first end portion of the first conductive line. Thereafter, the second conductive line may be formed, for instance by means of a damascene-style process or by a direct metal etch, such that a second end portion of the second conductive line can be arranged to abut the spacer from a side opposing the first end portion of the first conductive line. Further, a recess may be formed in the second conductive line, wherein the second mask layer may be formed in the recess. Generally, the recess may extend along only a part of the second conductive line, such that the second mask leaves a portion adjacent to the spacer uncovered.

The above-mentioned optional additional features of the method according to the first aspect apply, when applicable, to the structure according to the second aspect as well.

BRIEF DESCRIPTION OF THE DRAWINGS

The above, as well as additional objects, features and advantages of the present disclosure will be better understood through the following illustrative and non-limiting detailed description, with reference to the appended drawing. In the drawings, like reference numerals will be used for like elements unless stated otherwise.

FIGS. 1A-1H are cross sections illustrating process flows for forming a first and second conductive line above which an interconnection structure is to be formed.

FIG. 1A illustrates a structure where a first conductive metal line 101 is arranged on an insulating layer 103.

FIG. 1B illustrates a structure where a spacer 104 has been formed on a side wall of a first end portion of the first conductive line 101.

FIG. 1C illustrates a structure where a trench layer 105 has been provided, which may be used in a damascene process for forming the second conductive lines 108 illustrated in FIGS. 1F-1H.

FIG. 1D illustrates a structure defining trenches 107 in which the second conductive lines 108 are to be formed.

FIG. 1E illustrates trenches 107 that may be formed using the third mask layer 106 as an etch mask.

FIG. 1F illustrates the process of forming the second conductive line 108 by filling the trench with a conductive material, recessing the second metal line 108 to form a recess 109 extending along a portion of the second metal line 108, followed by forming a second mask layer 110 in the recess 109.

FIG. 1G further illustrates the process of forming the second conductive line 108 by filling the trench with a conductive material, recessing the second metal line 108 to form a recess 109 extending along a portion of the second metal line 108, followed by forming a second mask layer 110 in the recess 109.

FIG. 1H further show the process of forming the second conductive line 108 by filling the trench with a conductive material, recessing the second metal line 108 to form a recess 109 extending along a portion of the second metal line 108, followed by forming a second mask layer 110 in the recess 109.

FIG. 2 illustrates a first conductive layer 111 which has been formed above a first conductive line 101 and a second conductive line 108, similar to the ones disclosed above in connection with FIGS. 1A-1H.

FIG. 3 illustrates the first conductive layer 111 etched to form a set of third conductive lines 113, which may extend orthogonally to the underlying first and second conductive lines 101, 108.

FIG. 4 illustrates spacers 115 formed on side walls of the set of third conductive lines 113.

FIG. 5 illustrates that a via hole 116 may be formed between two neighboring spacers 115, extending through the first mask 102 to the underlying first conductive line 101.

FIG. 6 illustrates the via hole 116 that has been filled with a conductive material to form a second via connection 118.

FIG. 7 illustrates a set of fourth conductive lines 119 have been recessed and covered by a fourth mask layer 122, which may be similarly configured as the first, second or third mask layers described above with reference to the previous figures.

DETAILED DESCRIPTION OF THE DISCLOSURE

Figure 2:
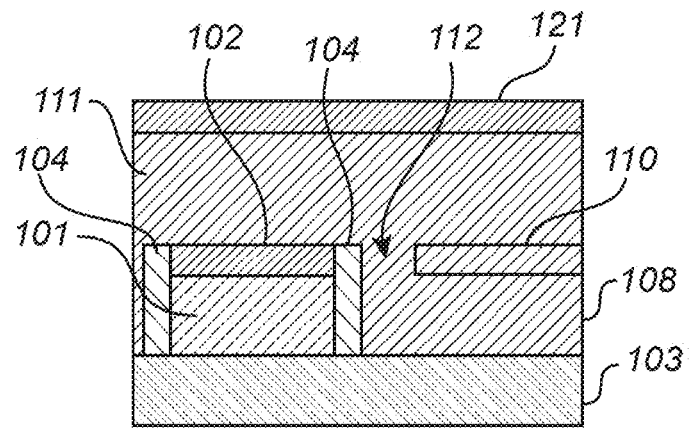
FIGS. 2-7 are cross sections illustrating process flows for forming an interconnection structure according to embodiments of the present disclosure.

A method for forming an interconnection structure, suitable for instance for a semiconductor device, will now be described with reference to the appended figures. FIGS. 1A-1H show exemplary method steps for providing a first and second conductive line above which the interconnection structure according to the present disclosure may be formed. Thus, FIGS. 1A-1H illustrate a method and structure which may precede the presently disclosure method illustrated by FIGS. 2-7 and may therefore be considered as a technical background explaining the present disclosure method and device as defined by the appended claims.

With reference to FIGS. 1A-1H, there is shown, in cross section, a portion of an intermediate structure or device. The structure may extend laterally or horizontally beyond the illustrated portion. The illustrated planes or layers extending through the structure are common to all the figures unless stated otherwise. It is noted that the relative dimensions of the shown elements, in particular the relative thickness of the layers, is merely schematic and may, for the purpose of illustrational clarity, differ from a physical structure.

In FIG. 1A, a first conductive metal line 101 can be arranged on an insulating layer 103. The insulating layer 103 may be formed of an electrically insulating material, typically a dielectric layer such as a layer of silicon oxide or some other conventional low-k dielectric layer. The first metal line 101 may be formed by forming a conductive layer on the insulating layer 103 and thereafter etching the first metal layer, using a first mask layer 102 as an etch mask. The first mask layer 102 may for instance be a hard mask composed of silicon oxide, silicon nitride, silicon carbon nitride or silicon carbide. It will however be appreciated that other materials could be used as well, such as spin-on oxide, and conductive materials which may be removed in later processing steps. The first mask 102 may be used as an etch mask for forming the first set of conductive lines 101 from the conductive layer. The first conductive line 101 may be formed by a metal etch process, also referred to as a direct metal etch.

In FIG. 1B, a spacer 104 can be formed on a side wall of a first end portion of the first conductive line 101. The spacer 104 may be formed by depositing a spacer layer, for example as a uniform layer, followed by a litho-etch sequence to achieve a desired location and thickness of the spacer 104. The spacer may, for example, have a thickness ranging from 2-14 nm, ranging from 8-12 nm, or ranging from 6-10nm.

In FIG. 1C a trench layer 105 has been provided, which may be used in a damascene process for forming the second conductive lines 108 illustrated in FIGS. 1F-1H. Thus, a third mask layer 106 may be formed on the trench layer 105, as depicted in FIG. 1D, defining trenches 107 in which the second conductive lines 108 are to be formed. The trenches 107 are shown in FIG. 1E and may thus be formed using the third mask layer 106 as an etch mask. It is understood that the trench layer 105 may differ from the spacer 104 regard to etch selectivity to allow the trench layer 105 to be etched while leaving the spacer 104 substantially intact. The trench layer 105 may also differ from the first mask layer 102 with regard to etch selectivity, which may be particularly advantageous in case the first mask layer 102 is partly exposed by the third mask layer 106. The trench 107 may hence be etched in a self-aligned fashion to the spacer 104.

FIGS. 1F-1H show the process of forming the second conductive line 108 by filling the trench with a conductive material, recessing the second metal line 108 to form a recess 109 extending along a portion of the second metal line 108, followed by forming a second mask layer 110 in the recess 109. Depending on the lateral extension of the recess 109 the second mask layer 110 may be laterally spaced apart from the spacer 104, leaving a contacting portion 112 between the second mask layer 110 and the spacer 104. The contacting portion 112 may form part of a first via structure connecting the second conductive line 108 to an upper interconnection level.

Method steps and an interconnection structure according to some embodiments of the present disclosure will now be discussed with reference to FIGS. 2-7, illustrating the interconnection structure being formed above a first conductive line 101 and a second conductive line 108 as shown in, for instance, FIG. 1H.

Thus, FIG. 2 discloses a first conductive layer 111 which can be formed above a first conductive line 101 and a second conductive line 108, similar to the ones disclosed above in connection with FIGS. 1A-1H. The first and second conductive lines 101, 108 may hence be arranged with a respective end portion abutting a separating spacer 104 and covered by a first mask layer 102 and a second mask layer 110, respectively. The second conductive line 108 is partly covered by the second mask layer 110, defining a contacting portion 112 of the first conductive layer to contact the second conductive line.

Figure 3:
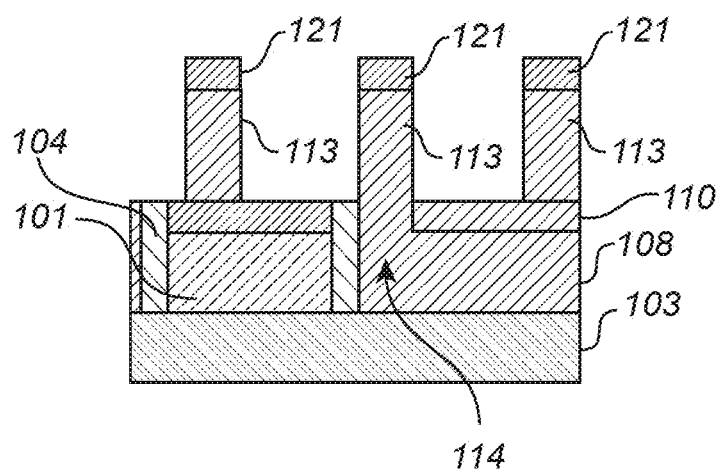

In FIG. 3, the first conductive layer 111 can be etched to form a set of third conductive lines 113, which may extend orthogonally to the underlying first and second conductive lines 101, 108. At least one line of the set of third conductive lines 113 may extend over the portion of the second conductive line 108 which is not covered by the second mask layer 110, thereby allowing the contacting portion 112 to form a first via connection 114 between the second conductive line 108 and the third conductive line 113. As shown in FIG. 3, the first via connection 114 may thus be arranged adjacent to the spacer 104 separating the first and second conductive lines 101, 108, and may in this way be self-aligned to the separating spacer 104.

The set of third conductive lines 113 may be formed by etching the first conductive layer 111, using a third mask layer 121 as an etch mask. The forming of the third conductive lines 113 may for instance comprise a sequence of lithography and etching steps (a "litho-etch sequence"), for example including a dry etching process such as a reactive ion etch (RIE) or ion beam etching (IBE). The etching process may be performed until the first and second mask layers 102, 110 are exposed, thereby using the first and second mask layers 102, 110 as an etch stop layer.

The first conductive layer 111 may be a metal layer, for instance comprising ruthenium (Ru), molybdenum (Mo), tungsten (W), aluminum (Al) or cobalt (Co), and alloys thereof. Generally, a metal is used which is suitable for patterning by means of metal etching, rather than damascene-style processing. The first conductive layer 111 may be deposited by CVD or atomic layer deposition (ALD). The first conductive layer 111 may also be deposited by physical vapor deposition (PVD) or electroplated. It will be appreciated that the first conductive layer 111 may be formed of a single layer of the aforementioned materials, or a multilayer combining two or more of the above examples.

The third mask layer 121 may, for example, be a hard mask composed of silicon oxide ($SiO_2$), silicon nitride (SiN), silicon carbon nitride (SiCN or silicon carbide (SiC). In some embodiments the third mask layer 121 may not be removed after the forming of the third conductive lines 113 but kept as a hardmask protecting the third conductive lines 113 during subsequent processing. It will however be appreciated that other materials could be used as well, such as conductive materials which may be removed in later processing steps.

Figure 4:
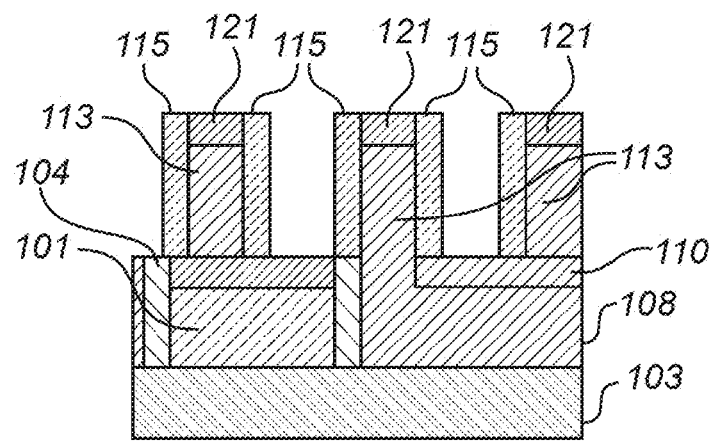

In FIG. 4, spacers 115 have been formed on side walls of the set of third conductive lines 113. The spacers 115 may, for instance, be formed of a layer of a dielectric material, and may in specific examples include a carbon-comprising material or a silicon-comprising material, such as amorphous carbon, polysilicon, amorphous silicon, silicon oxide, silicon nitride, or silicon carbide, which may be deposited for example by CVD or ALD. The deposition may be of an isotropic nature, resulting in a substantially conformal layer having the same thickness on surfaces in all directions. Alternatively, the deposition may be of a more anisotropic nature, in which the thickness of the resulting layer may vary in the horizontal and the vertical directions. In the structure illustrated in FIG. 4, any spacer material on horizontal surfaces has been etched or recessed, leaving the spacers 115 on the sidewalls of the third set of conductive lines 113.

Figure 5:
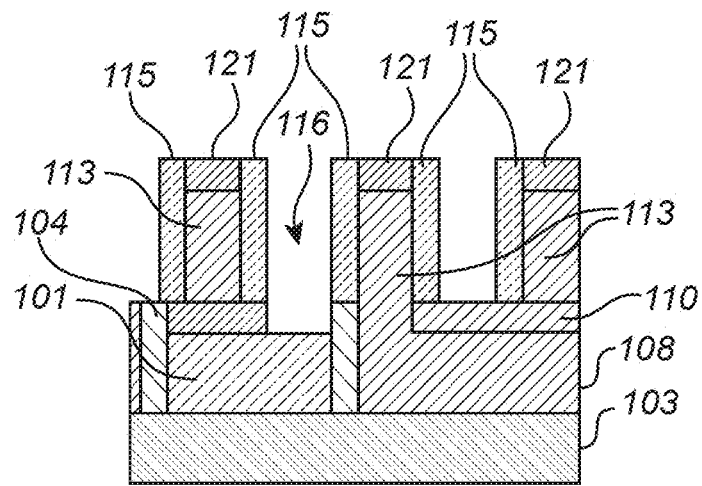

Thereafter, a via hole 116 may be formed between two neighboring spacers 115, extending through the first mask 102 to the underlying first conductive line 101 as illustrated in FIG. 5. In some embodiments, the via hole 116 may be etched using the spacers 115 as an etch mask, which hence allows for the via hole 116 to be self-aligned between the spacers 115. Further, the first and second mask 102, 110 may be etch-selective with respect to each other, thereby reducing the need for protecting the second mask 110 during the opening of the via hole 116.

Figure 6:
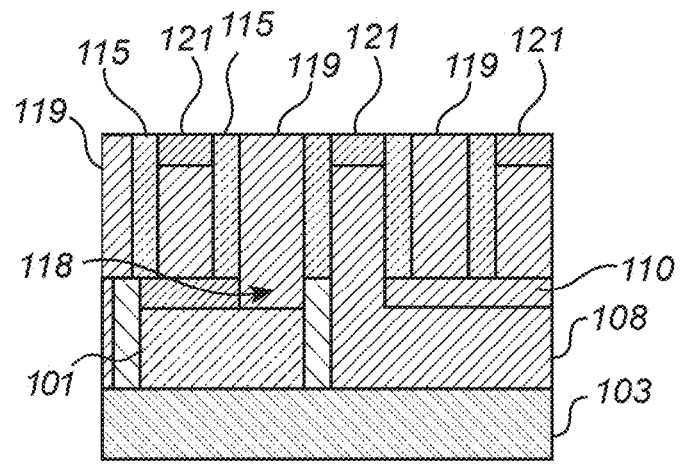

In FIG. 6, the via hole 116 has been filled with a conductive material to form a second via connection 118. With this arrangement, a tight spacing between the first and second via connections 114, 116 may be achieved, with the vias 114, 116 self-aligned to the spacer 104 between the first and second conductive lines 101, 108 and separated by the spacer line 115.

The conductive material may, for example, form part of a second conductive layer filling both the via hole 116 and the space between the neighboring spacers 115, thereby forming a set of fourth conductive lines 119 extending between the spacers 115. The fourth conductive lines 119 may hence extend in parallel along the third conductive lines 113, wherein the spacers 115 are arranged to separate the third conductive lines 113 from the fourth conductive lines 119. The fourth conductive lines 119 may hence be formed in a damascene-style process similar to the one described above for the forming of the second conductive lines 108. The conductive material forming the fourth conductive lines 119 may be similar as the material forming the third conductive lines 113, and may hence comprise, for instance, Ru, Mo, W, Al or Co or alloys thereof, which may be deposited between the spacer-lined set of third conductive lines 113. After deposition, excess material may be removed by CMP. It will be appreciated that due to the damascene-style process the fourth set of conductive lines 119 may be formed of conducting materials which are not particularly suitable for direct etching, such as for instance Cu.

Figure 7:
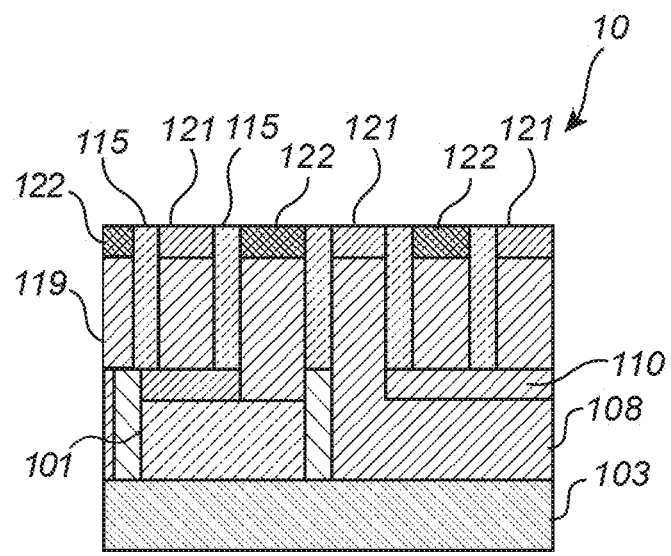

In FIG. 7, the set of fourth conductive lines 119 can be recessed and covered by a fourth mask layer 122, which may be similarly configured as the first, second or third mask layers described above with reference to the previous figures. Generally, the third and fourth mask layers 121, 122 may be selected from materials allowing for an etch selectivity between the two layers. As indicated in FIG. 7, a top surface of the third mask layer 121 and a top surface of the fourth mask layer 122 may be arranged on the same vertical level, thereby providing a flush surface of the interconnection structure 10.

In the above, the present disclosure has mainly been described with reference to a limited number of examples. However, as is readily appreciated by a person skilled in the art, other examples than the ones disclosed above are equally possible within the scope of the present disclosure, as defined by the appended claims. The method may hence in some embodiments refer to methods for forming an interconnection structure as illustrated in FIGS. 2-7, and in additional embodiments to method steps as illustrated with reference to FIGS. 1A-1H.

The invention claimed is:

1. A method for forming an interconnection structure for a semiconductor device, the method comprising:
    forming a first conductive layer above a first conductive line and a second conductive line, wherein the first and second conductive lines are arranged with a respective end portion abutting a spacer separating the first and second conductive lines from each other, wherein the first conductive line is covered by a first mask layer separating the first conductive line from the first conductive layer, and wherein the second conductive line is partly covered by a second mask layer, allowing a contacting portion of the first conductive layer to contact the second conductive line;
    etching the first conductive layer to form a set of third conductive lines, wherein at least one of the third conductive lines comprises the contacting portion forming a first via connection;
    forming spacers on side walls of the set of third conductive lines;
    forming, between two neighboring spacers, a via hole extending through the first mask layer to the underlying first conductive line; and
    depositing a second conductive layer filling the via hole to form a second via connection and forming a set of fourth conductive lines extending between the spacers.

2. The method according to claim 1, wherein the via hole is formed using said neighboring spacers as an etch mask, wherein the via hole is self-aligned to said neighboring spacers.

3. The method according to claim 1, wherein forming the spacers comprises depositing a spacer material to embed the set of third conductive lines and cover the first and second mask layers between the set of third conductive lines and the spacer separating the first and second conductive lines.

4. The method according to claim 1, wherein the second conductive layer fills gaps between the spacers.

5. The method according to claim 1, further comprising:
    prior to etching the first conductive layer to form the set of third conductive lines, forming a third mask layer defining the set of third conductive lines;
    recessing the set of fourth conductive lines; and
    forming a fourth mask layer covering the set of fourth conductive lines,
    wherein the third mask layer and the fourth mask layer differ with respect to etch selectivity.

6. The method according to claim 5, wherein a top surface of the third mask layer and a top surface of the fourth mask layer are arranged on a same vertical level.

7. The method according to claim 1, wherein the sets of third and fourth conductive lines extend orthogonally to the first and second conductive lines.

8. The method according to claim 1, wherein the first via connection is arranged adjacent to the spacer separating the first and second conductive lines.

9. The method according to claim 1, wherein the first conductive layer is formed of at least one of Ru, Mo, W, Al, and Co.

10. The method according to claim 1, further comprising, prior to forming the first conductive layer:
    forming the first conductive line on an insulating layer, using the first mask layer as an etch mask;
    forming the spacer on a sidewall of a first end portion of the first conductive line;
    forming the second conductive line, comprising a second end portion arranged to abut the spacer;
    forming a recess in the second conductive line; and
    forming the second mask layer in the recess.

* * * * *